United States Patent [19]
Karrick

[11] Patent Number: 5,347,540
[45] Date of Patent: Sep. 13, 1994

[54] DYNAMIC STORAGE ALLOCATION IN A LOGIC ANALYZER

[75] Inventor: Kevin C. Karrick, Aloha, Oreg.

[73] Assignee: Tektronix, Inc., Wilsonville, Oreg.

[21] Appl. No.: 910,059

[22] Filed: Jul. 8, 1992

[51] Int. Cl.⁵ .......................................... H04L 25/38
[52] U.S. Cl. ..................................... 375/10; 375/117; 370/48
[58] Field of Search .................... 375/25, 10, 114, 116, 375/117; 370/43, 48, 99, 100; 340/825.14

[56] References Cited

U.S. PATENT DOCUMENTS

| | | | |
|---|---|---|---|
| 4,048,440 | 9/1977 | Peck et al. | 370/48 |
| 4,353,032 | 10/1982 | Taylor. | |
| 4,512,026 | 4/1985 | Vander Meiden | 375/117 |
| 4,586,189 | 4/1986 | Tyrrell | 370/48 |
| 4,843,255 | 6/1989 | Stuebing. | |
| 4,857,760 | 8/1989 | Stuebing. | |
| 4,914,675 | 4/1990 | Fedele | 375/25 |
| 4,949,361 | 8/1990 | Jackson. | |
| 5,054,020 | 10/1991 | Meagher | 370/48 |

OTHER PUBLICATIONS

PM 3580 FAMILY Logic Analyzer Brochure (Philips) Fluke and Philips–The Global Alliance in Test & Measurement.

*Primary Examiner*—Stephen Chin
*Attorney, Agent, or Firm*—Boulden G. Griffith

[57] ABSTRACT

An apparatus and method for dynamic memory allocation conserves memory resources while providing efficient and effective interaction between concurrent synchronous and asynchronous acquisition of data for logic analysis. The apparatus includes circuitry for acquiring synchronous data, circuitry for acquiring asynchronous data, circuitry for generating timestamp values, circuitry for determining when the synchronous data is valid, circuitry for determining when the asynchronous data is valid, and circuitry for packing valid synchronous data and valid asynchronous data into a memory according to the sequence in which it was acquired with sufficient timestamp values included to permit reconstruction of the relative timing between all of the acquired data, with each data and timestamp value being identified with status bits to indicate whether it was synchronous data, asynchronous data, or a timestamp value. The method of dynamic memory allocation includes the steps of acquiring synchronous data, acquiring asynchronous data, generating timestamp values, determining when the synchronous data is valid, also determining when the asynchronous data is valid, and packing valid synchronous data and valid asynchronous data into a memory according to the sequence in which it was acquired with sufficient timestamp values included to permit reconstruction of the relative timing between all of the acquired data, with each data and timestamp value being identified with status bits to indicate whether it was synchronous data, asynchronous data, or a timestamp value.

6 Claims, 9 Drawing Sheets

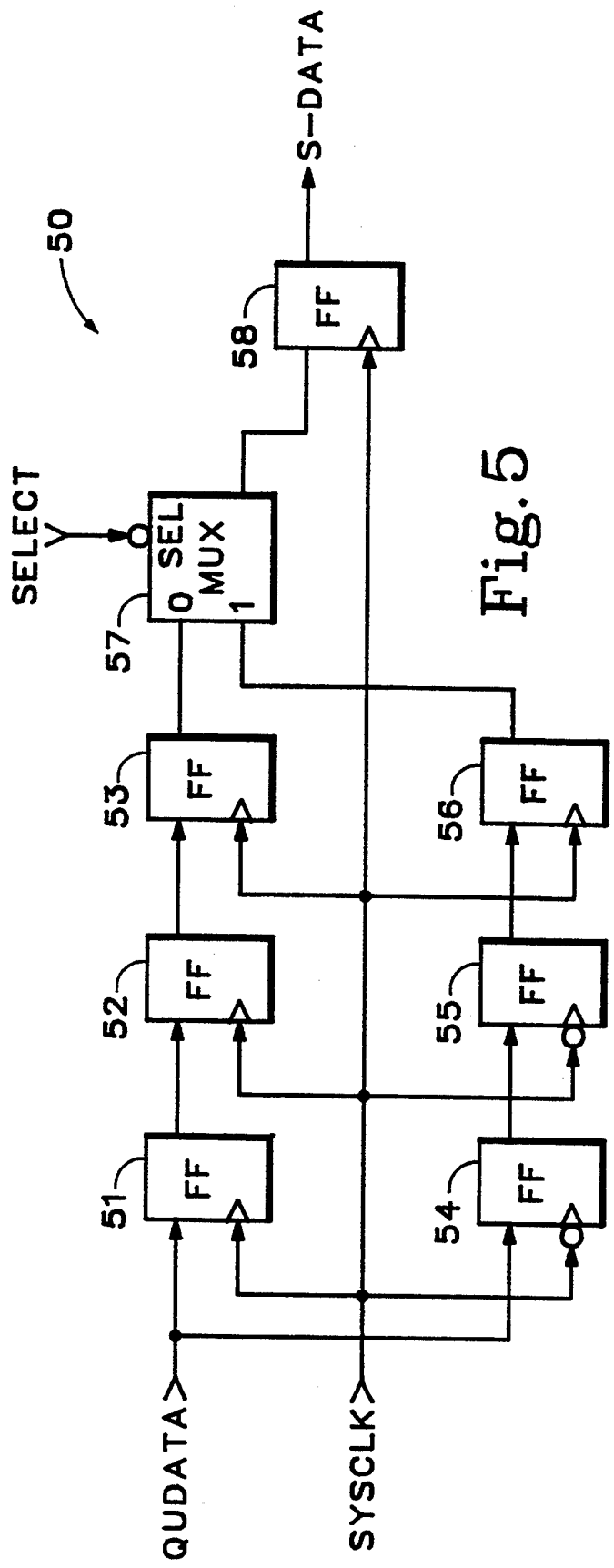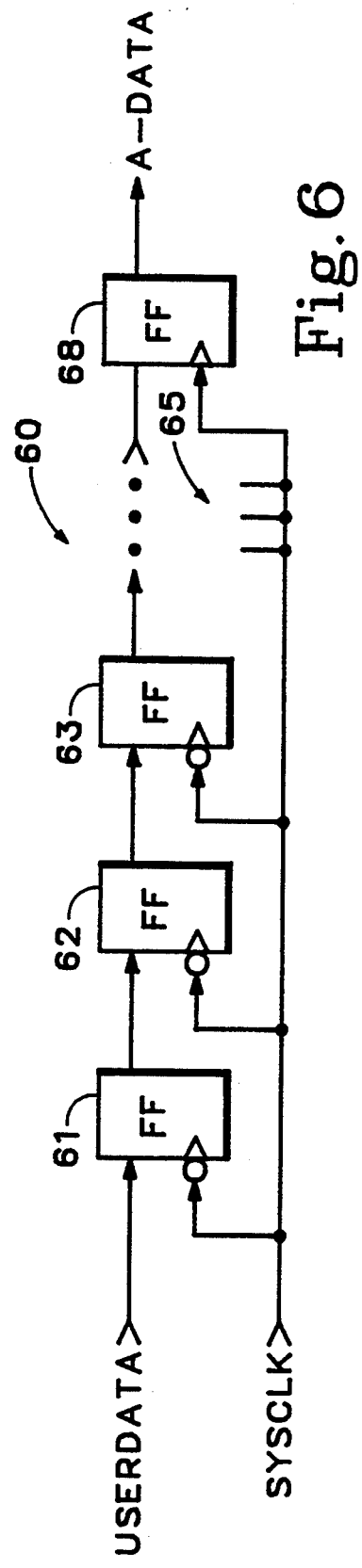

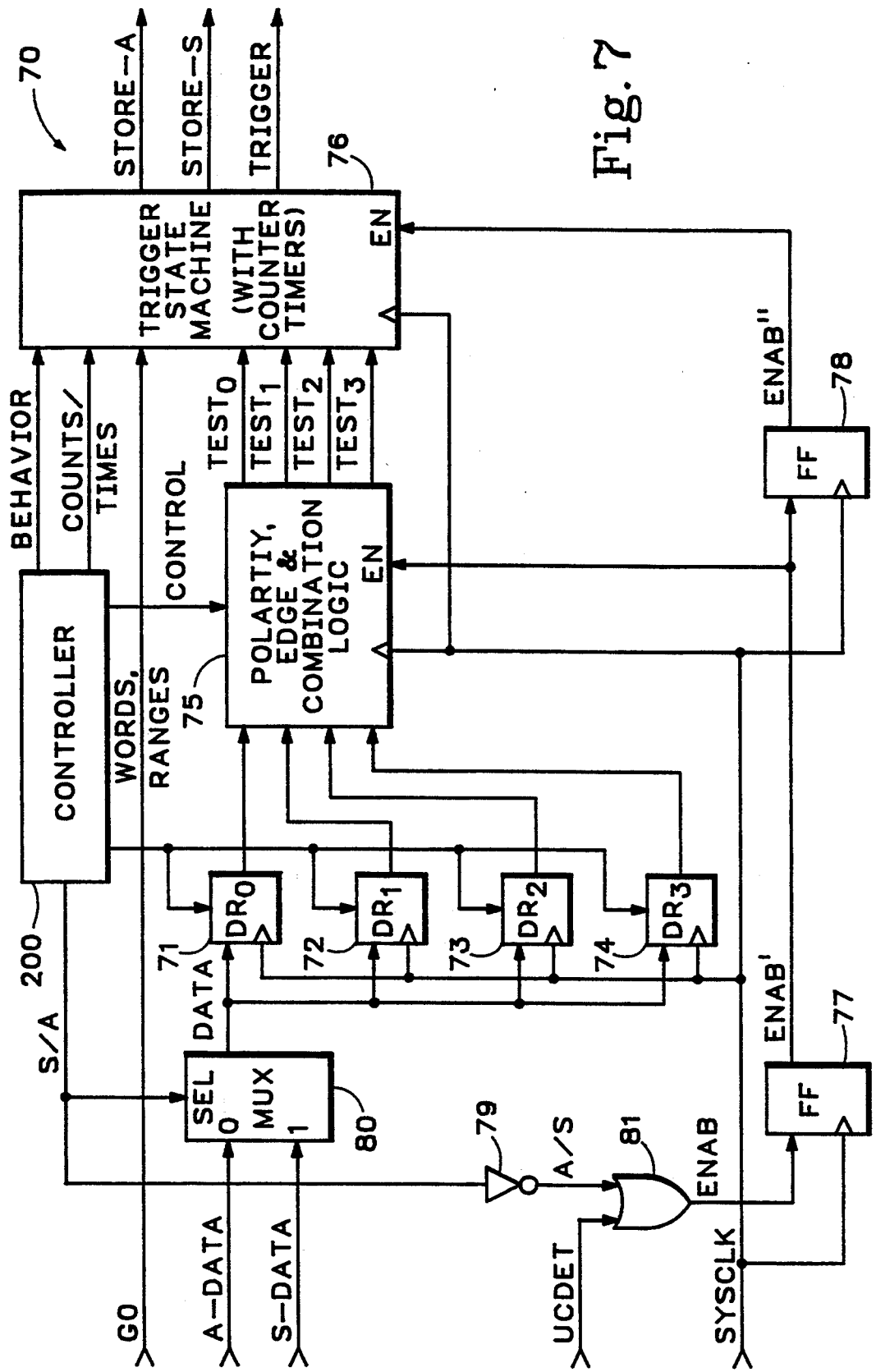

* DISCARDED DATA

| ADDRESS | BANK₀ | BANK₁ | BANK₂ | BANK₃ |
|---|---|---|---|---|
| 0 | S1 [1] | 100 [0] | S2 [1] | 104 [0] |
| 1 | S3 [1] | 106 [0] | A1 [2] | S4 [1] |
| 2 | 112 [0] | A2 [2] | S5 [1] | A3 [2] |

Fig. 10

| TIME | DATA |
|---|---|
| 100 | S1 |
| 101 | — |
| 102 | — |
| 103 | — |
| 104 | S2 |
| 105 | — |
| 106 | S3 |
| 107 | — |
| 108 | — |
| 109 | — |
| 110 | — |
| 111 | A1 |
| 112 | S4 |
| 113 | — |
| 114 | — |
| 115 | A2 |
| 116 | S5 |
| 117 | A3 |

Fig. 11

DYNAMIC STORAGE ALLOCATION IN A LOGIC ANALYZER

FIELD OF THE INVENTION

This invention relates to logic analyzers, and more particularly to a data acquisition circuitry architecture and method of operation that permits the dynamic allocation of the memory space used to hold acquired data in a logic analyzer.

BACKGROUND OF THE INVENTION

Logic analyzers have traditionally had two basic modes of data acquisition: synchronous and asynchronous. Synchronous data acquisition, or state analysis as it is also known, refers to the process of acquiring data at times determined by the active edge of the user's system clock signal. Asynchronous data acquisition, or timing analysis, refers to the process of acquiring data at times determined by the active edge of a clock that is generated by the logic analyzer. Asynchronous data acquisition is typically performed at sampling rates that are faster than the user's system clock in order to provide a closer look at the timing of particular signals.

A third kind of data, known as "glitch" data has also been acquired by logic analyzers. A "glitch" is usually defined as more than one transition across the logic threshold within one data acquisition interval, i.e., within the interval between successive active edges of the acquisition clock. For example, three transitions and a change in logic state, or two transitions and the same logic state, are both defined as glitches. More thorough discussions of glitches and means for detecting them are contained in U.S. Pat. Nos. 4,353,032, 4,843,255, and 4,857,760 for a "Glitch Detector", a "Self-Latching Monostable Circuit", and a "Bipolar Glitch Detector Circuit", respectively, all hereby incorporated by reference.

When glitches are being acquired, keeping track of glitch data requires as much memory as the corresponding data acquisition does. This is because every active clock edge on which data is sampled has associated with it the interval between that edge and the next edge during which a glitch can occur. Therefore, when glitches are being acquired, half of the available memory must be dedicated to storing glitch data. This means that either half of the memory depth or half of the memory width is utilized for this function.

To conserve the amount of memory required for data storage, "transitional" data storage is now frequently employed, especially in conjunction with asynchronous data acquisition. In this approach, rather than storing the logic state of a signal upon the occurrence of every acquisition clock signal, no data is stored for acquisition clock cycles in which no data has changed. When the data does change, the new data is stored along with a timestamp that provides a record of the time when the new data was acquired. Thus, memory is only used in direct proportion to the number of logic state transitions and, even though extra memory is required to store the timestamps, a considerable amount of memory is conserved in most circumstances.

It is frequently desirable to acquire both synchronous and asynchronous data in relationship to the same event. For example, if a hardware problem is suspected in certain circuitry, but it only seems to occur during specific kinds of operations, it might be desirable to use synchronous acquisition to monitor microprocessor operations until the specific kind of operation is occurring, and then trigger asynchronous data acquisition in the vicinity of the certain circuitry to learn more about the suspected problem.

In the past, this sort of cross-triggering of asynchronous acquisition by events detected through synchronous acquisition was accomplished by two logic analyzers, or two distinct portions of a single logic analyzer. However, this requires double probing of the circuitry under analysis. Also, when using two separate logic analyzers, the user must perform a calculation to determine the timing relationship between the synchronous data and the asynchronous data. When using a logic analyzer with integrated synchronous and asynchronous sections, the delay from probe tip to trigger machine and between trigger machines for each section may not be accurately aligned to place the timing data in the desired relationship with a synchronous event of interest.

Even in advanced logic analyzers, such as those in the Philips PM 3580 Family, which eliminate dual probing and provide a single trigger machine for both state and timing analysis, memory is pre-allocated to state, timing, or equally to both in advance. This is an inefficient use of memory when the user's interest in the data does not conform to these pre-allocations.

SUMMARY OF THE INVENTION

Accordingly, the present invention is an apparatus and method for dynamic memory allocation that conserves memory resources while providing efficient and effective interaction between concurrent synchronous and asynchronous acquisition of data for logic analysis.

The apparatus includes means for acquiring synchronous data, means for acquiring asynchronous data, means for generating timestamp values, means for determining when the synchronous data is valid, means for determining when the asynchronous data is valid, and means for packing valid synchronous data and valid asynchronous data into a memory according to the sequence in which it was acquired with sufficient timestamp values included to permit reconstruction of the relative timing between all of the acquired data, with each data and timestamp value being identified with status bits to indicate whether it was synchronous data, asynchronous data, or a timestamp value.

The method of dynamic memory allocation includes the steps of acquiring synchronous data, acquiring asynchronous data, generating timestamp values, determining when the synchronous data is valid, also determining when the asynchronous data is valid, and packing valid synchronous data and valid asynchronous data into a memory according to the sequence in which it was acquired with sufficient timestamp values included to permit reconstruction of the relative timing between all of the acquired data, with each data and timestamp value being identified with status bits to indicate whether it was synchronous data, asynchronous data, or a timestamp value.

BRIEF DESCRIPTION OF THE DRAWINGS

FIG. 5 is a schematic diagram of the synchronous sampler used in the data acquisition circuitry according to the present invention.

FIG. 6 is a schematic diagram of the asynchronous sampler used in the data acquisition circuitry according to the present invention.

FIG. 7 is a block diagram of the test, trigger, and storage control circuitry used in the data acquisition circuitry according to the present invention.

FIG. 10 is a memory allocation diagram showing how the data prepared as shown in FIG. 9 is actually stored in RAM.

FIG. 11 is table of time/data relationships reconstructed from the data shown in FIG. 10.

DETAILED DESCRIPTION OF THE INVENTION

Figure 1:
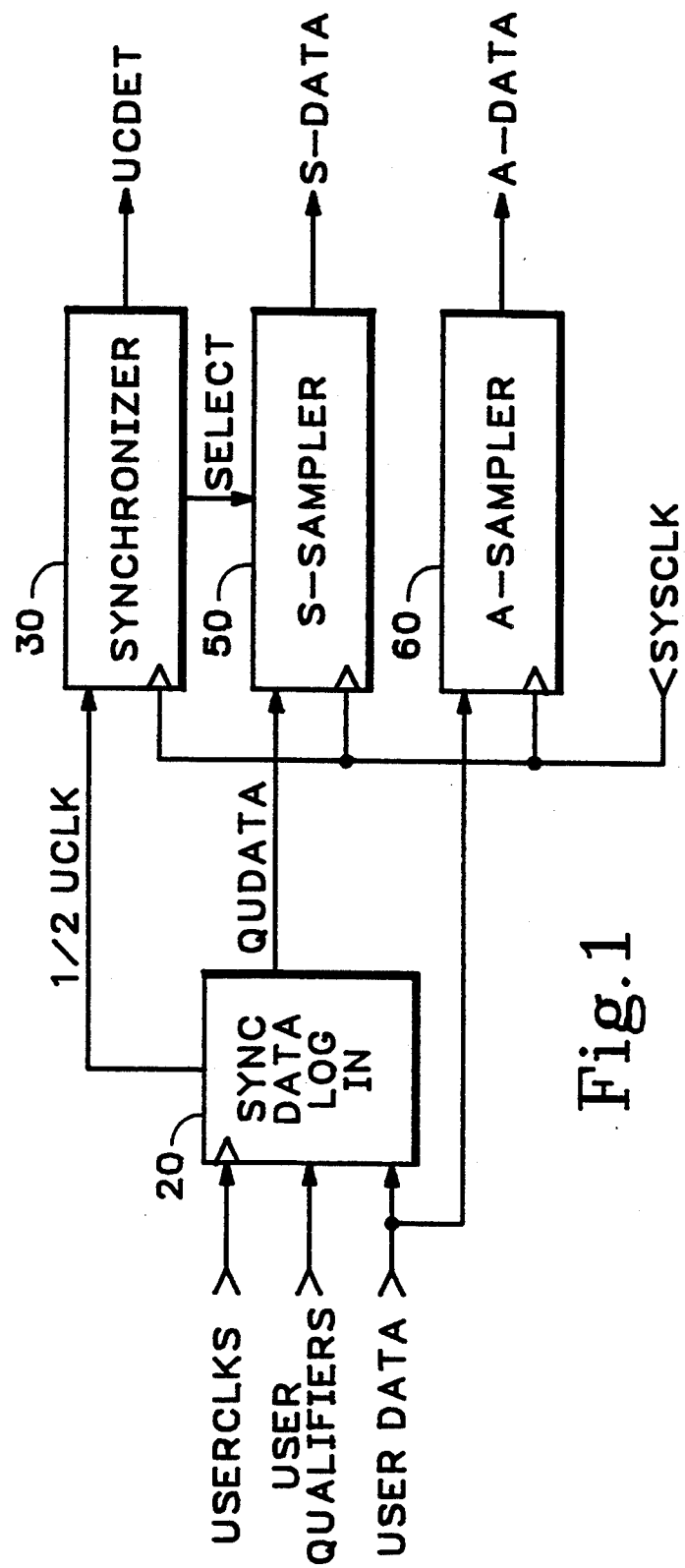
FIG. 1 is a block diagram of a portion of the data acquisition circuitry that implements the method of the present invention.

Referring to FIG. 1, synchronous data log-in circuitry 20 monitors the user's clock signal, USERCLKS, the USER's QUALIFIERS, and the USER's DATA signals to be monitored. The synchronous data log-in circuitry 20 produces ½UCLK and QUDATA. ½UCLK is a consolidated version of the user's clocks that runs at half speed. QUDATA is a version of the USER DATA that is synchronized to a full speed version of UCLK and that has been qualified by selected combinations of the USER's QUALIFIERS. Hence, QUDATA is "qualified user data".

The USER's DATA is also applied to A-sampler 60, which asynchronously samples the USER's DATA at times determined by SYSCLK, the data acquisition circuitry's system clock signal. A-sampler 60 produces asynchronous data, A-DATA, as its output. Note that, while this data derived from asynchronous acquisition will be referred to below as "asynchronous" and identified as "A-DATA", it is manipulated synchronously to SYSCLK throughout the rest of the circuitry to be described; i.e., the label "asynchronous" only refers to its origin.

½UCLK is monitored by synchronizer 30, which also receives the acquisition system clock, SYSCLK. The synchronizer 30 produces UCDET and SELECT. UCDET (user's clock detected) is a signal that goes active during the system clock signal cycle that immediately follows a valid user's clock active edge. SELECT is a signal that is sent to S-sampler (synchronous sampler) 50 to indicate which half cycle of the system clock the user's clock active edge occurred in. The function of both of these signals will be further described below.

The S-sampler 50 receives QUDATA from the synchronous log-in circuitry 20, SELECT from the synchronizer 30, and SYSCLK, the data acquisition circuitry system clock. The S-sampler produces synchronous data, S-DATA, as its output.

Figure 2:
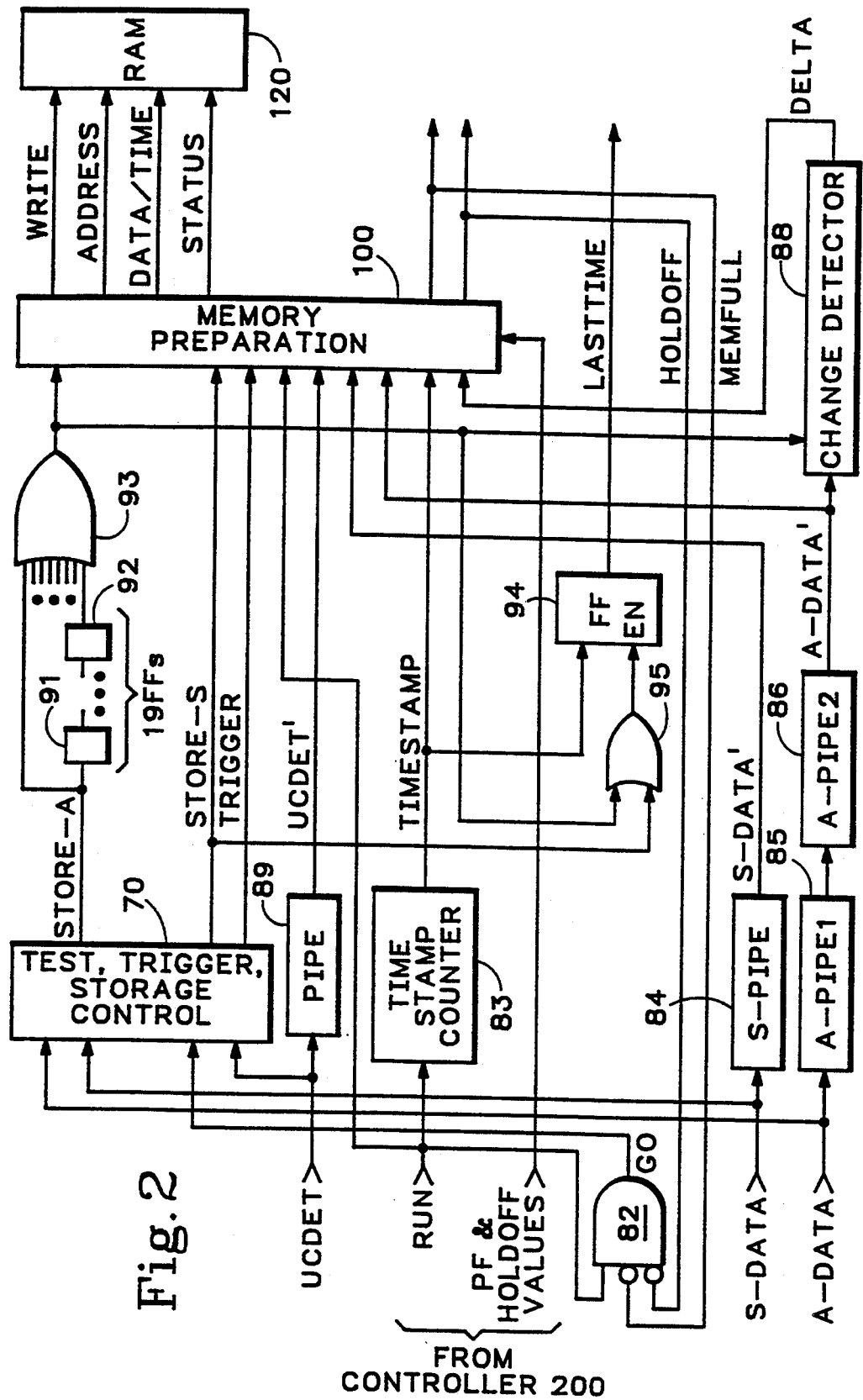
FIG. 2 is a block diagram of the remainder of the data acquisition circuitry that implements the method of the present invention.

Referring now to FIG. 2, the UCDET, S-DATA, and A-DATA outputs of the circuitry shown in FIG. 1, as well as a RUN signal and PF (post-fill) and HOLD-OFF values, are inputs to the remaining portion of the data acquisition circuitry shown in this Figure. (The SYSCLK signal is a "not shown" input to all of the circuitry shown in FIG. 2 except the AND gate 82 and OR gate 93.) The RUN signal is produced by a system controller (200, FIG. 7), and tells the data acquisition circuitry when to commence a new data acquisition. AND gate 82 produces GO signal that enables the test, trigger, and storage control circuitry 70 when RUN is true and HOLDOFF and MEMFULL (memory full) are both false. The PF (post-fill) and HOLDOFF values tell the memory preparation circuitry 100 how long to keep filling memory after a TRIGGER and how long to hold GO off while prefilling the memory, respectively.

The test, trigger, and storage control circuitry 70 receives S-DATA, A-DATA, UCDET, and the ENable signal output of AND gate 82, and produces STORE-A, STORE-S, and TRIGGER signals. The STORE-S and TRIGGER signals are applied directly to memory preparation circuitry 100, while the STORE-A signal is stretched by 19 system clock pulses before being applied to the memory preparation circuitry 100. STORE-A is stretched to be a minimum of 20 system clock pulses in width by the operation of OR gate 93 which monitors STORE-A and the output of the 19 flip-flops 91–92.

The memory preparation circuitry receives delayed signals S-DATA', A-DATA', and UCDET'. UCDET' is a version of UCDET that has been delayed by pipe 89 to compensate for the delay through the test, trigger, and storage control circuitry 70. S-DATA' is a version of S-DATA that has been delayed by passage through S-pipe 84, while A-DATA' is a version of A-DATA that has been delayed by passage through both A-pipe1 85 and A-pipe2 86. S-pipe and A-pipe1 compensate for the delay of test, trigger, and storage control circuitry 70, while A-pipe2 and the pulse stretching circuitry of flip-flops 91–92 and OR gate 93 operate to provide a storage window of asynchronous data centered around a specified event in the synchronous data. The memory preparation circuitry 100 also receives a HOLDOFF VALUE directly from the controller 200.

Change detector 88 detects changes in A-DATA' and produces an active DELTA signal whenever such changes occur. Also, whenever the stretched STORE-A output of OR gate 93 changes state, indicating the beginning or end of an asynchronous acquisition, the change detector 88 responds by asserting DELTA to force the storage of an asynchronous sample. This is to ensure that asynchronous data is stored in memory, even if no data transition occurs.

Time stamp counter 83 starts counting in response to the rising edge of the RUN signal and produces thereafter a TIMESTAMP value that is the final input to the memory preparation circuitry 100. Flip-flop 94 stores a copy of each TIMESTAMP value for one SYSCLK cycle, so that it is able to retain the LASTTIME value at the end of an acquisition, as will be further described below.

The memory preparation circuitry 100 produces /WRITE (not write) and ADDRESS controls for RAM (random access memory) 120. The memory preparation circuitry 100 also supplies data in the form of DATA/TIME and STATUS to be written into RAM 120. In addition, the memory preparation circuitry 100 supplies HOLDOFF and MEMFULL signals to AND gate 82 and to external circuitry, including the controller 200.

Figure 3:
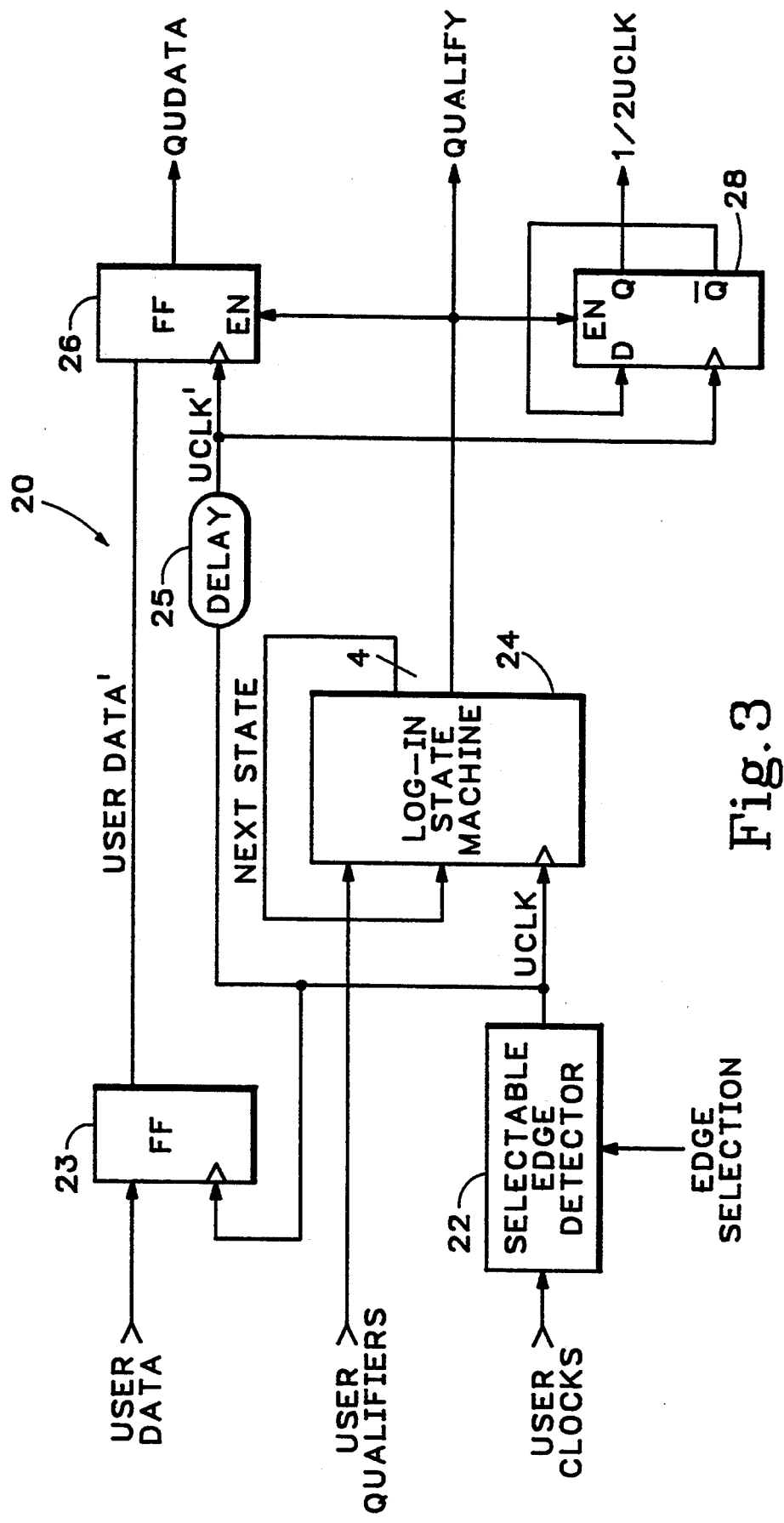
FIG. 3 is a block diagram of the synchronous data log-in circuitry used in the data acquisition circuitry according to the present invention.

Referring now to FIG. 3, the synchronous data log-in circuitry 20 of FIG. 1 can be seen here in relative detail. Multiple USER CLOCKS, typically four, are applied to the input of selectable edge detector 22. The EDGE SELECTION control signals from the system controller (not shown) determine which edges of which USER CLOCKS the selectable edge detector 22 will respond to. According to these instructions, the selectable edge detector produces UCLK, a consolidated version of the user's system clocks, by ORing together pulses produced in response to the selected rising or falling edges of the selected USER CLOCKS.

The UCLK signal clocks USER DATA into flip-flop 23 which holds it until the log-in state machine 24 has had a chance to produce a QUALIFY result, as is further described below. Delay element 25 produces a delayed version of UCLK, UCLK', which is used to clock the output of flip-flop 23, USER DATA', into flip-flop 26 after the log-in state machine 24 has had a chance to produce a valid QUALIFY signal if it is going to.

The UCLK' signal is divided by two at flip-flop 28, whose /Q output is connected to be its D input, to produce ½UCLK. The UCLK' signal also clocks USER DATA into flip-flop 26 (which actually represents a number of such flip-flops, as does flip-flop 23). Flip-flops 26 and 28 are both enabled by a QUALIFY signal from the log-in state machine 24. The log-in state machine 24 is programmed to produce the QUALIFY signal based on its present state and the state of its USER QUALIFIERS inputs.

Figure 4:
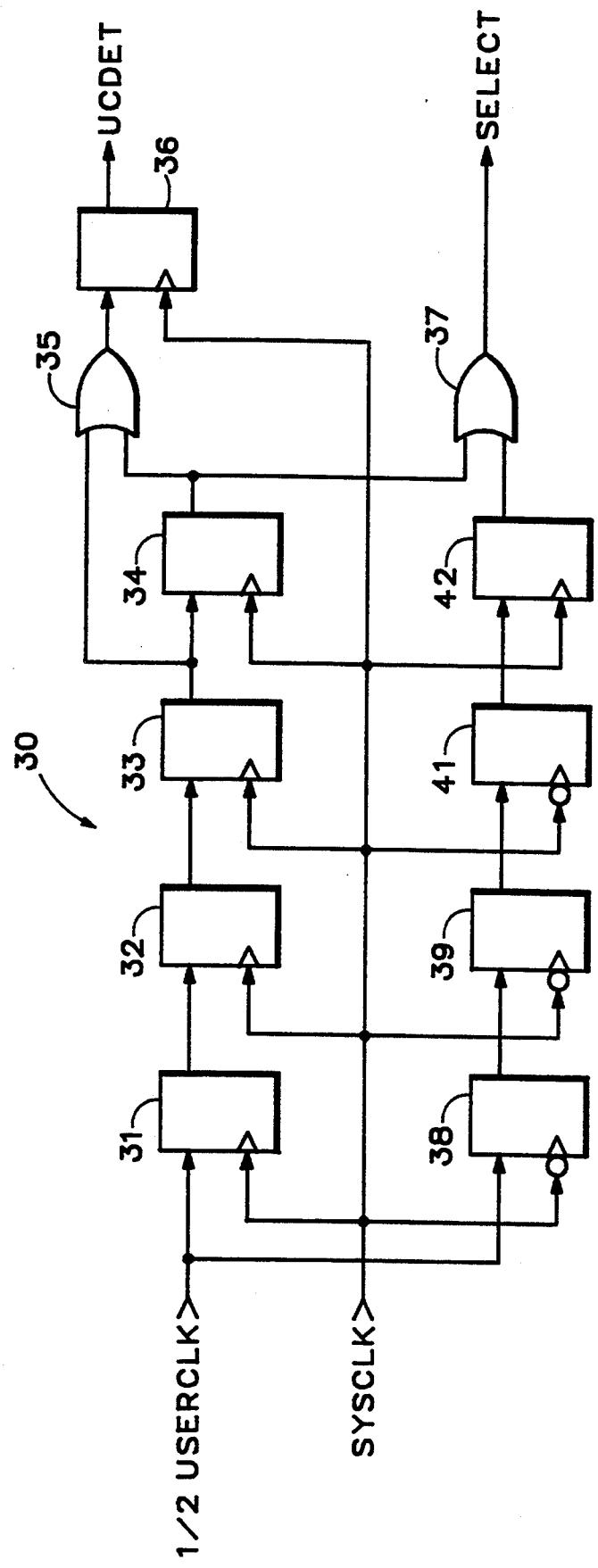
FIG. 4 is a schematic diagram of the synchronizer used in the data acquisition circuitry according to the present invention.

Referring now to FIG. 4, the synchronizer 30 shown in FIG. 1 is shown in greater (schematic) detail in this Figure. ½UCLK is applied to the D inputs of flip-flops 31 and 38. Flip-flops 31–34 and 42 are clocked by SYSCLK, while flip-flops 38–41 are clocked by an inverted version of SYSCLK. Each of these strings of flip-flops serve to reduce the likelihood of metastability propagating throughout their length. As is further described in U.S. Pat. No. 4,949,361 to Jackson for a "Digital Data Transfer Synchronization Circuit and Method", hereby incorporated by reference, XOR gate 35 monitors the outputs of the last two flip-flops 33 and 34 in the upper string to detect transitios of the ½ UCLK signal. Active outputs of XOR gate 35 are clocked into flip-flop 36 by the next active (hith-goint) edge of SYSCLK. The output of flip-flop 36 is the clock detected signal, UCDET.

Since flip-flops 38–41 are clocked 180° out of phase relative to flip-flops 31–34, they resolve the timing of transitions in ½UCLK by an extra factor of two, so that it is less than or equal to the period of the system clock, SYSCLK. This information from flip-flop 41 is delayed one half clock period less and brought into phase with the information in flip-flop 34 as a result of flip-flop 42's being clocked by SYSCLK rather than /SYSCLK (not-SYSCLK). XOR gate 37 detects when the contents of flip-flops 34 and 42 are unequal to produce the SELECT signal. Thus, the SELECT signal indicates when ½UCLK edges were in the second half of SYSCLK, from 180°–360°, while /SELECT indicates when the ½UCLK edges were in the second half of SYSCLK, from 0°–180°.

Referring now to FIG. 5, the S-sampler (synchronous sampler) shown in FIG. 1 is shown in greater (schematic) detail in this Figure. QUDATA (qualified user data) is clocked into flip-flop 51 by SYSCLK and into flip-flop 54 by /SYSCLK. The output of flip-flop 51 then passes through flip-flop 52 and into flip-flop 53 on the next two active (rising) edges of SYSCLK. The output of flip-flop 54 passes through flip-flop 55 and then into flip-flop 56, where it is brought into time alignment with the data in flip-flop 53. Multiplexer 57 receives the output of flip-flop 53 on its "0" input and the output of flip-flop 56 on its "1" input. The SELECT signal from the synchronizer 30 controls which input to multiplexer 57 is produced as its output, thus ensuring that the resulting synchronous data is accurately associated with the correct user clock edge and closest acquisition system clock. Flip-flop 58 receives the selected output from multiplexer 57 on its input and clocks it in on the next SYSCLK to produce S-DATA as its output. The data that is selected for S-DATA is that which was sampled one half of a SYSCLK period later than the SYSCLK edge that sampled ½UCLK.

Referring next to FIG. 6, the A-sampler (asynchronous sampler) 60 shown in FIG. 1 is shown in greater (schematic) detail in this Figure. USER DATA is clocked into flip-flop 61 on the active (rising) edges of /SYSCLK (which occur at the same time as the falling edges of SYSCLK). This data is then clock through flip-flops 62–65 and into flip-flop 68 on the occurrence of an active edge of SYSCLK. The length of the A-sampler path, i.e., the number of flip-flops represented by 65, is chosen to align together S-DATA and A-DATA samples that were taken one half cycle apart, as is further described below.

FIG. 7 shows in relative detail the test, trigger, and storage control block 70 shown in FIG. 2. An S/A (synchronous, not-asynchronous) signal from the controller 200 selects between the S-DATA and A-DATA inputs to multiplexer 80 for application to the inputs of four data recognizers, $DR_0$ 71 through $DR_3$ 74. WORDS, RANGES signals from the controller 200 program the data recognizers 71–74 with word and range recognition values that the selected DATA signals from multiplexer 80 are compared with. The determination as to whether or not the specified conditions are satisfied is determined at the active edge of SYSCLK.

The logic analyzer prior art contains a number of disclosures dealing with word recognition, range recognition, event recognition, etc. Specifically, U.S. Pat. Nos. 4,475,237 to Glasby for "Programmable Range Recognizer", 4,752,928 to Chapman et al. for "Transaction Analyzer", 4,789,789 and 4,801,813 to Kersenbrock et al. for "Event Distribution and Combination System(s)", 4,823,076 to Haines for "Method and Apparatus for Triggering", and 4,849,924 to Providenza et al. for "Event Counting Prescaler", all hereby incorporated by reference, describe a variety of such recognizers, many of which would be suitable for use as data recognizers $DR_0$ 71 through $DR_3$ 74.

The polarity, edge, and combination logic 75 examines the outputs of the data recognizers $DR_0$ –$DR_3$ 71–74 and determines whether any of four programmable tests, $TEST_1$–$TEST_3$, are satisfied. Each test can be programmed by CONTROL signals from the controller 80 to include events from the data recognizers or their absence (event not), transitions into or out of events, and sequences or combinations of events.

Most of the polarity, edge and combination logic 75 only operates during times when it is enabled by ENAB', a version of the output of OR gate 81, ENAB, that has been delayed for one cycle of SYSCLK by flip-flop 77. An exception is the timers within the trigger state machine 76 which run once they are started even while ENAB" is inactive. During synchronous triggering operations OR gate 81 is satisfied whenever UCDET (user's clock detected) is active high. During asynchronous triggering operations OR gate 81 is always satisfied by the high output of inverter 79, A/S (asynchronous, not-synchronous).

Upon receiving an active GO signal, the programmable (RAM-based) trigger state machine 76 monitors the test outputs $TEST_0$-$TEST_3$, and determines the state of its STORE-A, STORE-S, TRIGGER outputs according to BEHAVIOR and COUNT/TIMES signals from the controller 200. To limit its operation to valid cycles, the trigger state machine 76 is enabled by ENAB", a version of ENAB' that has been further delayed one SYSCLK cycle by flip-flop 78.

Figure 8:
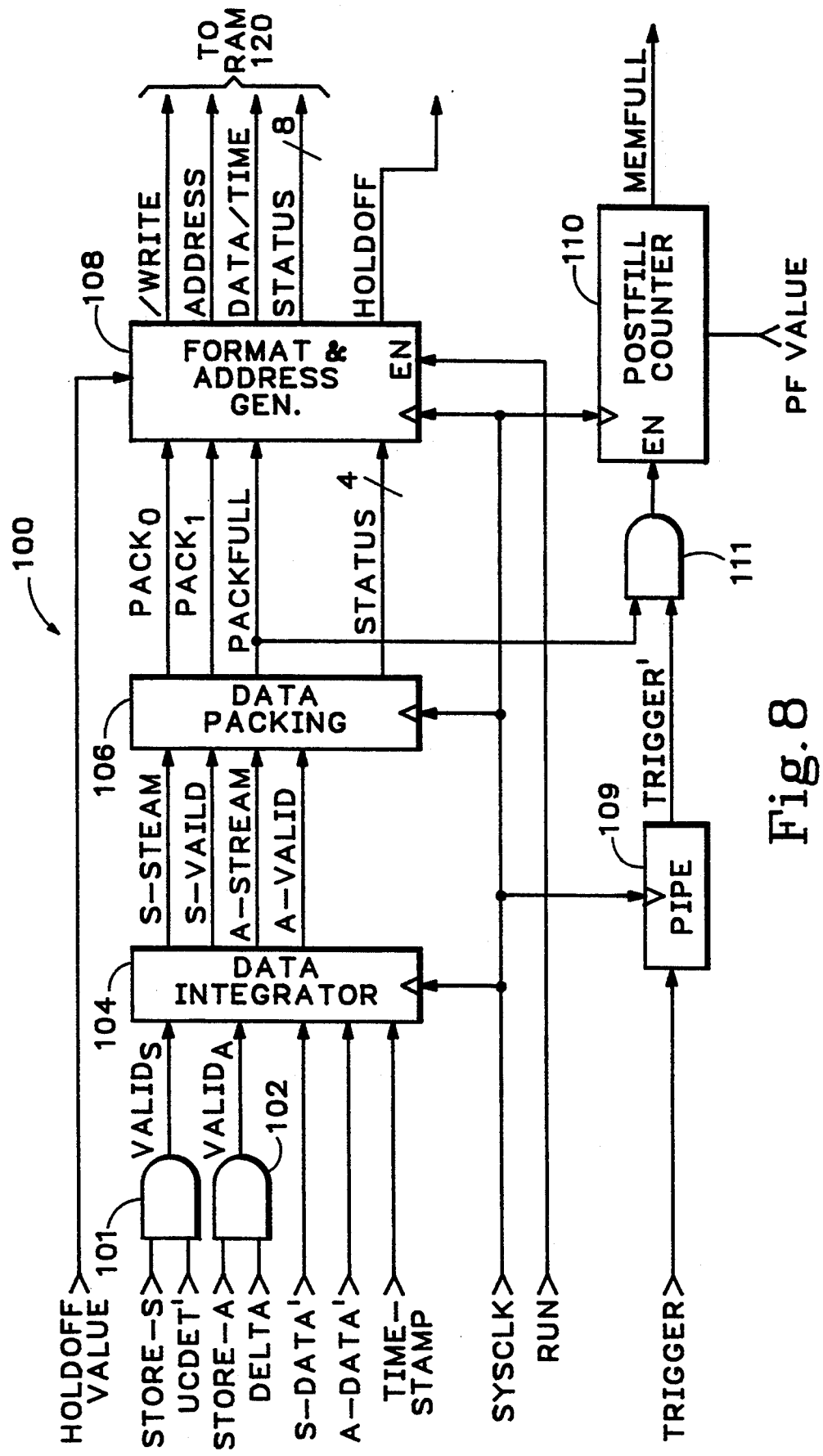
FIG. 8 is a block diagram of the memory preparation circuitry used in the data acquisition circuitry according to the present invention.

Referring next to FIG. 8, the memory preparation circuitry 100 shown in FIG. 2 is shown in relative detail in this Figure. Data integrator 104 is clocked by SYSCLK and receives as inputs S-DATA', A-DATA', and TIMESTAMP information, as well as $VALID_S$ and $VALID_A$, signals from AND gates 101 and 102, respectively. $VALID_S$ is true when both STORE-S and UCDET' are true, while $VALID_A$ is true when both STORE-A and DELTA are true.

The dam integrator 104 supplies two multi-bit signals, S-STREAM and A-STREAM, and two single-bit signals, S-VALID and A-VALID, to data packing circuitry 106. The S-VALID signal is a delayed version of the $VALID_S$ signal and is active (high) when S-STREAM contains valid synchronous data. The A-VALID signal is a delayed version of the $VALID_A$ signal and is active (high) when A-STREAM contains valid asynchronous data.

The data packing circuitry 106 supplies two multi-bit signals, $PACK_0$ and $PACK_1$, four STATUS bits, two of which are associated with each PACK signal, and a single bit signal, PACKFULL, that indicates when the PACK signals contain new data. The pairs of STATUS bits have the following significance: 00=TIMESTAMP, 01=SYNC, and 10=ASYNCH (with 11=unused).

The postfill counter 110 is enabled by the output of AND gate 111, which has TRIGGER' and PACKFULL as its inputs. TRIGGER' is a version of the TRIGGER signal that has been delayed by pipeline 109. The postfill counter 110 counts down from the value PFVALUE (postfill value) upon those occurrences of SYSCLK that occur while PACKFULL is high after TRIGGER' has gone high. When zero is reached, MEMFULL (memory full) is generated.

The format and address generation circuitry 108 is enabled by RUN and clocked by SYSCLK to demultiplex $PACK_0$ and $PACK_1$ and their associated STATUS signals into DATA, TIME, and associated STATUS signals at twice the width and half the frequency. It also generates ADDRESS and /WRITE signals to control the RAM 120, and a HOLDOFF signal whose duration is determined by the HOLDOFF VALUE input that it receives from the controller 200 (FIG. 2). The HOLDOFF signal is used to prevent a trigger from occurring before the RAM has had a chance to prefill when the operator wishes to view activity that occurs before the trigger.

Figure 9:
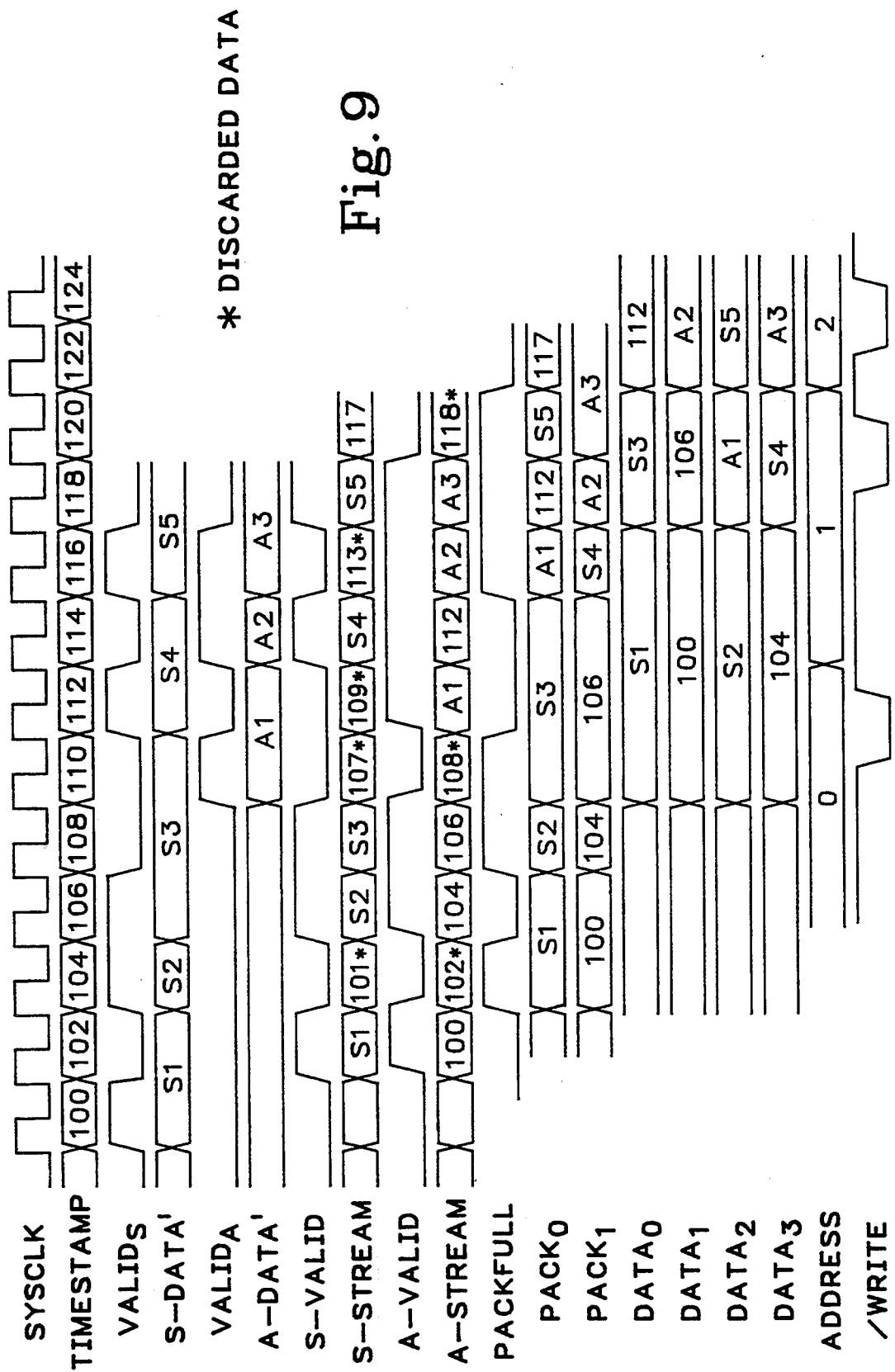
FIG. 9 is a timing diagram illustrating the operation of the memory preparation circuitry shown in FIG. 8.

Referring now to FIG. 9, as well as FIG. 8, the data integrator 104 produces its outputs S-STREAM, S-VALID, A-STREAM, and A-VALID from its inputs as shown in this Figure. Note that the TIMESTAMP data at the top of FIG. 9 increments by two on each clock, so that the TIMESTAMP values associated with data acquired on rising edges of SYSCLK are all even while the TIMESTAMP values associated with data acquired on falling SYSCLK edges are all odd. (To avoid confusion with numbers associated with circuit blocks, TIMESTAMP values and synchronous and asynchronous data values are shown in italics, such as 100, S1, and A1 throughout the following discussion.)

Note in FIG. 9 that $VALID_A$ is not active (high) until the rising edge of the SYSCLK associated with the TIMESTAMP value 110. This could be because the A-DATA' is not changing and therefor the change detector 88 has not caused DELTA to go active, or it could be because STORE-A has not yet been activated by the test, trigger, and storage control circuitry 70. In either event, the A-DATA' is not of interest prior to this interval.

During the SYSCLK cycle while the TIMESTAMP value is 100, $VALID_S$ goes active, indicating that S-DATA' is valid at that time. Therefore, the first valid synchronous data in this example is S1. Additional valid synchronous data values S2 and S3 are identified by $VALID_S$ at the times corresponding to the TIMESTAMP values of 104 and 106. During the interval while the TIMESTAMP value is 102, neither $VALID_S$ nor $VALID_A$ is active and the data on S-DATA' and A-DATA' are both invalid.

During the interval corresponding to the TIMESTAMP value 102, and in response to the presence of valid S-DATA' during the interval corresponding to the TIMESTAMP value 100, the data integrator 104 produces an active S-VALID signal and places the S1 data on its S-STREAM output. At the same time A-VALID also goes active and TIMESTAMP value 100 is placed on the A-STREAM output. During the next clock cycle, while the current TIMESTAMP value is 104, the S-STREAM and A-STREAM outputs of the data integrator contain TIMESTAMP values 101 and 102, respectively. However, the S-VALID and A-VALID signals remain inactive (low) and these TIMESTAMP values are discarded.

During the interval corresponding to the TIMESTAMP values 104 and 106, $VALID_S$ is again active and S2 and S3 appear sequentially on the S-DATA' lines. During the interval corresponding to the TIMESTAMP value 106, the data integrator 104 places S2 on its S-STREAM output, TIMESTAMP value 104 on its A-STREAM output, and makes S-VALID and A-VALID active to notify the data packing circuitry 106 aware that valid data is present on its inputs.

During the interval corresponding to the TIMESTAMP value 108, the data integrator 104 places S3 on its S-STREAM output, TIMESTAMP value 106 on its A-STREAM output, and again makes S-VALID and A-VALID active again to notify the data packing circuitry 106 of the valid data on both of its data inputs.

By the time of the interval corresponding to the TIMESTAMP value 104, the data packing circuitry 106 has received synchronous data value S1 and TIMESTAMP value 100, and placed them on its $PACK_0$ and $PACK_1$ outputs, respectively. PACKFULL is asserted during this same interval to notify the format and address generation circuitry 108 of the valid data on its inputs. The STATUS signals at the output of the data packing circuitry 106 are delayed versions of the STATUS signals at its input.

The format and address generation circuitry 108 latches in the PACK₀ and PACK₁ values S1 and 100 at the end of the interval corresponding to the TIMESTAMP value 104 will not make any of its outputs available until they all are ready at the beginning of the interval corresponding to the TIMESTAMP value 110, at which time S1 and 100 will appear on its DATA₀ and DATA₁ outputs, respectively.

During the interval corresponding to the TIMESTAMP value 108, the data packing circuitry 106 causes PACKFULL to go active (high) again and produces S2 at its PACK₀ output and 104 at its PACK₁ output. At the end of the interval corresponding to the TIMESTAMP value 108, the format and address generation circuitry 108 accepts the PACK₀ and PACK₁ data on its inputs, and presents those same values, S2 and 104, on its DATA₂ and DATA₃ outputs, respectively, during the interval corresponding to the next TIMESTAMP value 110.

The DATA₀–DATA₃ outputs of the format and address generation circuitry 108 all contain valid data, S1, 100, S2, and 104, during the interval corresponding to the TIMESTAMP value 110. In this example, the current ADDRESS being supplied to the RAM 120 is 0, so when /WRITE (not write) goes active-low the DATA₀ through DATA₃ values are written into the RAM 120 at this address.

Returning now to the top of FIG. 9, at the time interval corresponding to TIMESTAMP value 106, S-DATA' goes to the value S3 and VALID$_S$ remains active (high). Accordingly, during the next SYSCLK cycle, the time interval corresponding to TIMESTAMP value 108, the outputs of the data integrator, S-STREAM and A-STREAM, carry the values S3 and 106, respectively, and both S-VALID and A-VALID remain active (high).

During the interval corresponding to the next TIMESTAMP value, 110, the PACKFULL output of the data packing circuitry 106 remains active (high) and the PACK₀ and PACK₁ outputs are presenting the values S3 and 106 to the format and address generation circuitry 108, which is presently outputting S1, 100, S2, and 104. The format and address generation circuitry 108 latches in these values and holds them until it has another full set of outputs ready.

Returning again to the top of FIG. 9, at the time interval corresponding to TIMESTAMP value 108, S-DATA' remains at the value S3 and VALID$_S$ goes to inactive (low). Since VALID$_S$ is low, indicating that the S3 value is no longer valid data, the data integrator 104 places the next TIMESTAMP values, 107 and 108 on S-STREAM and A-STREAM next. ("Next" in this context means the next after the last, 106.) This data is not meaningful, since neither S-VALID nor A-VALID is active while it is present, and it will be discarded.

During the interval corresponding to the TIMESTAMP value 110, VALID$_S$ is low but VALID$_A$ goes high for the first time. The low (inactive) level of VALID$_S$ reflects that fact that S3 is old, invalid data. The active (high) level of VALID$_A$ indicates that the asynchronous data A-DATA', with the value A1, is now valid. During the next SYSCLK cycle, the interval corresponding to TIMESTAMP interval 112, the data integrator 104 produces the A1 data on A-STREAM and an active high level on A-VALID to indicate the validity of the value on A-STREAM. Since there wasn't any valid synchronous data, the TIMESTAMP value 109, which does not correctly correspond to the acquisition time of the A1 data, is placed on S-STREAM, but is identified as invalid by the inactive (low) state of S-VALID. The correct TIMESTAMP value for A1 is 111, as will be seen below when the interpretation of the final memory contents is explained. The data packing circuitry 106 stores the valid A1 value and ignores the invalid 109 value.

During the interval corresponding to the TIMESTAMP value 112 VALID$_A$ goes low, indicating that A-DATA' is no longer valid, and VALID$_S$ goes high, indicating that the value S4 on S-DATA' is valid synchronous data. In response to these inputs, during the next SYSCLK cycle (corresponding to TIMESTAMP value 114) the data integrator 104 places S4 on the S-STREAM and TIMESTAMP value 112 on the A-STREAM and marks them both as valid by causing S-VALID and A-VALID to go (or stay) high.

The data packing circuitry 106 responds to the new valid data values S4 and 112 during interval 114 by latching them in and, during the 116 interval, putting the A1 value which it received earlier and the S4 value which it just received on its PACK₀ and PACK₁ outputs, respectively, and exerts PACKFULL to inform the format and address generation circuitry 108 that the PACK$_x$ signals are valid. The 112 value that was present on A-STREAM is held until it can be paired with the next valid data received.

At time 118, when the format and address generation circuitry 108 receives the A1 and S4 values, it immediately places them on its DATA₂ and DATA₃ outputs, respectively. At the same time, also puts the S3 and 106 values that it received back at time 110 on its DATA₀ and DATA₁ outputs, respectively. The ADDRESS output of the format and address generation circuitry 108 had already been changed from 0 to 1 at time 114 after the active /WRITE pulse (low-going) during times 110 and 112, so everything is now ready for the active /WRITE pulse that occurs in times 118 and 120.

Returning to the top of FIG. 9, at time 114 VALID$_S$ goes low, indicating that the S4 value on S-DATA' is no longer valid. At the same time, VALID$_A$ goes high to indicate that a new, valid value, A2, is present on A-DATA'. At time 116 the data integrator 104 responds to these inputs by putting A2 in the A-STREAM and another invalid time value, 113, on the S-STREAM. The high on A-VALID and low on S-VALID reflect the respective validity and invalidity of the values A2 and 113. At time 118 the data packing circuitry 106 puts the 112 TIMESTAMP value on PACK₀ and the A2 asynchronous data value on PACK₁ and keeps PACKFULL asserted to cause the format and address generation circuitry 108 to accept this data as the next valid data to be written to the RAM 120.

Starting again at the top of FIG. 9, this time at time 116, VALID$_S$ goes high to indicate that there is a new valid synchronous data value, S5, present on the S-DATA' lines. At the same time VALID$_A$ remains high indicating that A-DATA' also has a new valid data value, A3. At time 118 the data integrator places S5 and A3 on S-STREAM and A-STREAM, respectively, and asserts both S-VALID and A-VALID. At time 120 the data packing circuitry 106 puts these same values, S5 and A3, on the PACK₀ and PACK₁ lines, and asserts PACKFULL, thus making these values available to the format and address generation circuitry 108.

Having previously received two valid pieces of data, 112 and A2, when the format and address generation circuitry receives these two pieces, S5 and S3, it puts all four of them on DATA$_0$–DATA$_3$, respectively, and changes the ADDRESS from 1 to 2. Half a SYSCLK cycle later /WRITE is asserted (low) and this data is written to the RAM 120.

FIG. 10 shows the data sent to memory in FIG. 9 as it resides in the RAM 120 after acquisition is complete. Memory banks BANK$_0$–BANK$_3$ receive their data from data lines DATA$_0$–DATA$_3$, respectively. Each item of data in the memory is supplied with a tag derived from the pair of STATUS bits that accompanied it from the format and address generation circuitry 108. These pairs of STATUS bits have the following significance: 00=TIMESTAMP, 01=SYNC, and 10=ASYNCH.

To aid in reconstructing the timing of the acquired data, when an acquisition ends, the absence of both STORE-S and the stretched version of STORE-A (from OR gate 93) disable OR gate 95 and the enable input to flip-flop 94, thereby causing the TIMESTAMP value associated with the last data value in memory to be retained in flip-flop 94. In our example this LASTTIME value is 117. Software then performs post-acquisition processing to recreate the time/data relationship for display.

FIG. 11 is table of time/data relationships reconstructed from the data shown in FIG. 10 and the contents of the LASTTIME flip-flop 94. Referring now to FIGS. 10 and 11, the post-processing software starts at the end of memory which was filled last and associates with it the LASTTIME value 117. Thus, time 117 is associated with asynchronous data value A3. By knowing how the memory preparation circuitry 100 has processed the data for storage, the software knows that the TIMESTAMP values contained in the acquisition memory are those associated with the data stored immediately in front of them in memory. Adjacent data values of the opposite type, such as the synchronous value S5 residing next to the asynchronous value A3, have TIMESTAMP values that are one apart. Thus, S5 has a TIMESTAMP value of 116, and A2 has a TIMESTAMP value of 115. Continuing backward through memory, the next TIMESTAMP value is 112, and it is associated with synchronous data S4. Since asynchronous data value A1 is adjacent to S4, it has the TIMESTAMP value 111. S3, S2, and S1 each have their own TIMESTAMP value stored immediately after them in memory.

The memory preparation circuitry 100 that is shown in FIG. 8 and whose operation is illustrated in FIG. 9 accomplishes a data compaction and labeling function that is unique and distinctly advantageous. Notice, in FIG. 9, how the DATA$_0$–DATA$_3$ lines fill and transfer data more slowly on the left and faster on the right. The slower rate on the left reflects the fact that only synchronous data is being acquired before TIMESTAMP value 110, while the faster rate on the right reflects the fact that after time 110 both synchronous and asynchronous data are being acquired at once.

Referring again to FIGS. 10 and 11, as well as FIG. 9, note that when data is changing slowly, the memory preparation circuitry 100 stores a TIMESTAMP value with each piece of data, adopting transitional storage. But that when synchronous and asynchronous data are being acquired rapidly, on every half SYSCLK cycle, the data is packed together without TIMESTAMP values to conserve space. This maximizes the effective bandwidth of the acquisition memory without the need for a separate timestamp memory. Moreover, the transition between these two modes is automatic and dynamic, so that memory allocation is optimized. Note how the system switches rapidly back and forth between these two modes from time 112 to time 115.

It should be noted that the present invention permits windows of detailed asynchronous data to be placed around events of interest in the synchronous data, much like "A delayed by B" provides an expanded view of a portion of a signal of interest in the oscilloscope world. Moreover, these windows can be precisely positioned with respect to those events.

When asynchronous acquisition is enabled, i.e., when STORE-A is high, the circuitry described above operates to capture glitches that have a duration of 10 ns or greater. Moreover, this glitch detection leads to the display of actual data, rather than just an indication that something occurred. And, because asynchronous data acquisition can be turned on and off "on-the-fly" according to preprogrammed criteria, glitch capture can be selectively enabled to conserve memory.

A more traditional glitch capture capability could be realized by replacing UCDET with a periodic signal at the frequency of SYSCLK, or SYSCLK/n for slower operation. This would yield 5 ns glitch capture for a system with SYSCLK running at 100 MHz. 2.5 ns glitch detection can be realized by using a four phase version of the same system clock signal and reducing the number of effective channels by a factor of four to provide the increased bandwidth through the rest of the acquisition hardware.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope of the invention.

I claim:

1. A method of dynamic memory allocation between synchronous and asynchronous data acquired by a test instrument for digital data acquisition and analysis, the method comprising the steps of:

acquiring synchronous data from a first input signal source at times determined by a clock source external to the test instrument;

acquiring asynchronous data from a second input signal source at times determined by a clock source internal to the test instrument;

generating timestamp values;

determining by reference to the clock source external to the test instrument when the synchronous data is valid;

determining when the asynchronous data is valid; and packing valid synchronous data, valid asynchronous data, and timestamp values into a memory according to a sequence in which the synchronous data and asynchronous data was acquired, with each data and timestamp value being identified with status bits to indicate which was synchronous data, which was asynchronous data, and which was a timestamp value.

2. An apparatus for dynamically allocating memory space between synchronous and asynchronous data acquired by a test instrument for digital data acquisition and analysis comprising:

means for acquiring synchronous data from a first input signal source at times determined by a clock source external to the test instrument;

means for acquiring asynchronous data from a second input signal source at times determined by a clock source internal to the test instrument;

means for generating timestamp values;

mean for determining by reference to the clock source external to the test instrument when the synchronous data is valid to produce valid synchronous data;

mean for determining when the asynchronous data is valid to produce valid asynchronous data; and means for packing the valid synchronous data, the valid asynchronous data, and the timestamp values into a memory according to a sequence in which the synchronous data and asynchronous data was acquired, with each data and timestamp value being identified with status bits to indicate which was synchronous data, which was asynchronous data, and which was a timestamp value.

3. A method according to claim 1 wherein the second input signal source is the same as the first input signal source.

4. An apparatus according to claim 2 wherein the second input signal source is the same as the second input signal source.

5. A method according to claim 1 wherein the packing step comprises the steps of:

associating timestamp values with stored data when a data acquisition rate permits; and storing data without timestamp values when the data acquisition rate causes data acquisition to occur at a maximum rate.

6. An apparatus according to claim 2 wherein the means for packing associates timestamp values with stored data when a data acquisition rate permits and stores the data without timestamp values when the data acquisition rate is maximum.

* * * * *